April 8, 1969 D. LUNINE 3,436,819

MULTILAYER LAMINATE

Filed Sept. 22, 1965

INVENTOR.
DAVID LUNINE
BY Frederic P. Smith
ATTORNEY

United States Patent Office 3,436,819

Patented Apr. 8, 1969

3,436,819
MULTILAYER LAMINATE

David Lunine, Los Angeles, Calif., assignor to Litton Systems, Inc., Beverly Hills, Calif.

Filed Sept. 22, 1965, Ser. No. 489,219
Int. Cl. H05k 3/00; B23p 25/00
U.S. Cl. 29—628 4 Claims

ABSTRACT OF THE DISCLOSURE

A method of forming a multilayer laminate in which a series of individual printed circuit boards are sequentially laminated to one another and metalized holes are formed through the partially formed laminate existing before the addition of each succeeding board to connect the circuit patterns on each such successive partially formed laminate.

Figure 1A:
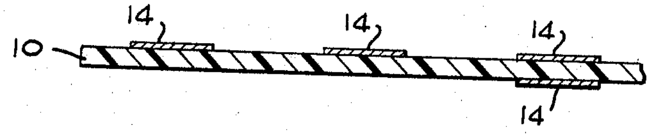

This invention relates in general to multilayer interconnection boards and in particular to a novel method of fabricating a multilayer interconnection board in which the circuit configurations existing at the various planes of the board can be internally connected and contact be made thereto from the surface of the multilayer laminate.

In the last several decades, there has been intensive research and development work done in the use of "printed wiring" as a method for interconnecting the functional components in electrical systems. As is well known, the advances in this art were necessitated in order to take advantage of the progress made in reducing the size of components in elementary circuits. The first interconnection schemes were literally patterns of conductive ink printed on insulating planes. As electronic systems became more complex, requiring the interconnection of greater numbers of functional components, the chemically etched circuit board was developed. This consisted generally of lines of copper formed by chemically etching in a preferential manner a continuous copper cladding on an insulating mounting board.

More recently, the trend to higher density packaging and to microelectronics has made it desirable to develop a circuit package consisting of several layers of these chemically etched circuit boards. The main problem involved in such multilayer laminates has been achieving of satisfactory electrical interconnections between different planes of circuitry in the board and external contact to such different planes of circuitry. Although many techniques have been attempted to achieve such interconnections, they have on the whole proved to be less than satisfactory.

One such technique, called the "Plated Through Hole" method and described in U.S. Patent No. 3,102,213 issued Aug. 23, 1963, involves the design of circuitry such that a plurality of large metal pads are left on all the circuit layers which are to be interconnected. After the separate layers are bonded together, holes are mechanically drilled through the entire board passing through the successive metallic pads. The walls of these holes are then plated to establish interconnection between the different pads. This technique has the obvious disadvantage that it results in a type of "picket fence" arrangement in the board which severely restricts the number of circuit lines which can be placed on the layers; alternatively, the circuit lines must be made dangerously narrow between the holes. In addition, each layer of circuitry must be designed so as to avoid all the holes which might be drilled through it, whether or not such holes are to be used as interconnection points. Because of such design limitations, it has been determined that many more boards are needed for the multilayer laminate than would be necessary if holes were placed only where desired.

The present invention has succeeded in overcoming the above-mentioned disadvantages by providing a process of fabricating a multilayer laminate in which holes are selectively formed through incrementally thicker layers of the multilayer laminate as each new layer of the laminate is bonded to the previous layers. As each new series of holes are formed, the holes are metallically plated to form interconnections between the various layers of circuitry and to the external surface of the multilayer laminate, each of the holes extending through the multilayer laminate only as far as desired.

It is therefore the primary object of the present invention to provide a new and improved multilayer laminate and the method of manufacture thereof.

It is another object of the invention to provide a process of forming a multilayer laminate in which the interconnections do not have to pass through the entire laminate.

It is another object of the present invention to provide a multilayer laminate in which the interconnections start at one surface and pass through only a preselected number of layers thereof.

It is a further object of the invention to provide a multilayer laminate in which the terminal layers for each interconnection can be vasually inspected to ascertain that the interconnection has been placed properly.

The novel features which are believed to be characteristic of the invention, both as to its organization and method of operation, together with further objects and advantages thereof, will be better understood from the following description considered in connection with the accompanying drawings. It is to be expressly understood, however, that the drawings are for purposes of illustration and description only and are not intended as a definition of the limits of the invention.

Figure 1B:
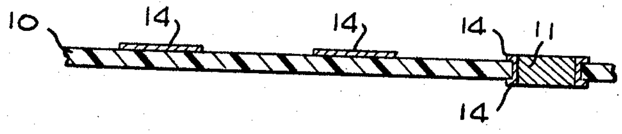
Figure 1C:
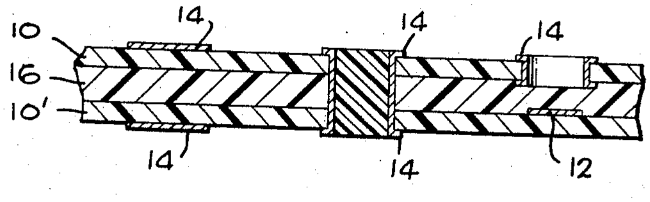
Figure 1D:
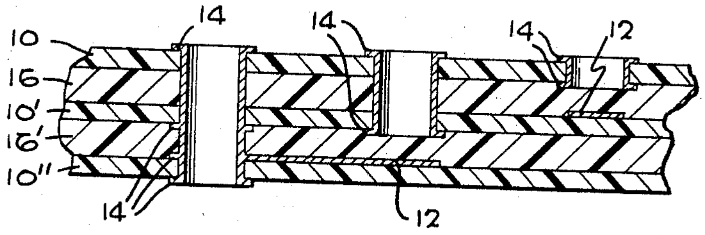
Figure 2:
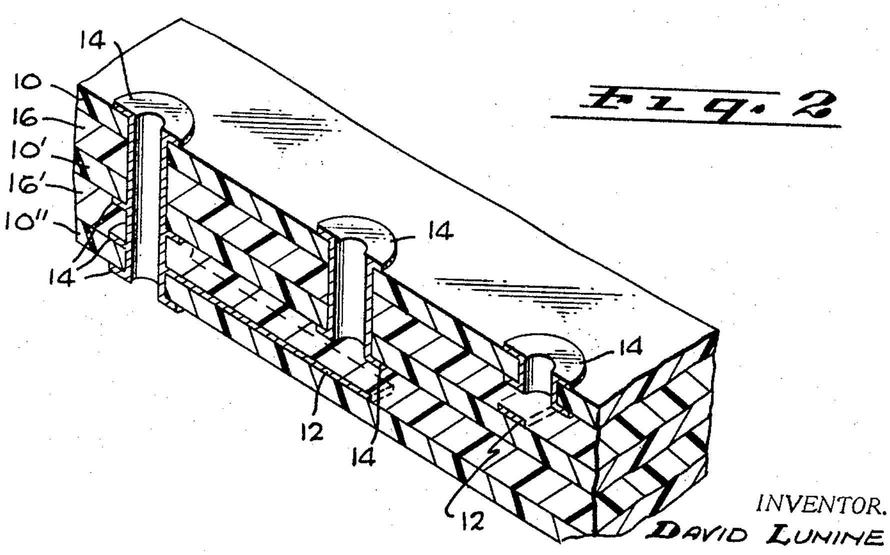

FIGURES 1*a–d* illustrate a preferred method of manufacturing the multilayer laminate of the present invention; and FIGURE 2 is a partly cross-sectional, partly isometric view of the multilayer laminate of FIGURE 1.

In the description of the invention to follow, corresponding reference numerals have been carried over throughout the figures to designate like parts of the invention.

In FIGURE 1*a*, a substrate 10 is shown consisting generally of a non-conductive material such as an insulating plastic or fiberglass cloth impregnated with epoxy resin. The substrate 10 has a printed circuit thereon etched, for example, from layers of copper bonded to both sides thereof. The printed circuit may consists of conductors 12, such as shown in FIGURE 1*c* and FIGURE 2, and interconnection pads 14. The printed circuit pattern is composed, in this embodiment, of copper approximately 1.5 mils in thickness, while substrate 10 itself is approximately 10 mils in thickness. The first step of manufacturing the multilayer laminate consists of forming holes in substrate 10 to connect the pads 14 on the top surface of substrate 10 with the pads 14 on the bottom surface of substrate 10. The wals of the holes, designated by numeral 11, are then plated, as shown in FIGURE 1*b*, with a conductive material so as to provide an electrical connection between the top and bottom surface of the substrate 10. At this step of the process, only those holes are drilled which wil go solely through substrate 10.

In FIGURE 1*c*, an insulating layer 10' is shown bonded to insulating layer 10 by means of a layer 16 of plastic material which has been partially cured (generally known in the art as "pre-preg"). The insulating layer 10' has a series of pads 14 thereon and a conducter 12, the pads 14 and the conductor 12 being part of a printed circuit pattern on layer 10'. Holes are then formed through layers 10 and 10' (and layer 16) to selectively connect the pads 14 on the top surface of layer 10 with the pads 14 on the bottom surface of layer 10'. The walls of the holes are then plated to form an electrical connection between such pads. It should be noted, as before, that only those holes are drilled at this step in the process which will go solely through layers 10, 16 and 10', i.e. from the top surface to the then bottom surface of the multilayer laminate.

In FIGURE 1*d*, a third step in this repetitive process is shown. Insulating layer 10'', having pads 14 on both sides thereof, is bonded by means of layer 16' to layer 10'. A hole is then formed from the top surface of layer 10 to the bottom surface of layer 10''. The wall of this hole is then plated so as to form an electrical connection between the pad on the top surface of layer 10, the pad on the bottom surface of layer 10''; in addition, electrical connection is made to the pads on the bottom surface of layer 10' and the top surface of layer 10''. As shown more clearly in FIGURE 2*b*, the pad on the top surface of layer 10'' has a connector 12 leading therefrom which forms part of the printed circuit board on the top surface of layer 10''.

It is thus apparent that this process may be repeated an indefinite number of times depending upon the allowable thickness of the multilayer laminate and the complexity of the circuit patterns. The holes formed through the multilayer laminate may be made by drilling, punching, or chemically etching. In addition, as shown in FIGURES 1*b* and 1*c*, the holes may be filled with a conducting material so as to provide a solid type of interconnection post, instead of merely a plated wall, or may be filled with a non-conducting material to prevent collapse of the hole during bonding.

Having thus described the invention, it is apparent that numerous modifications and departures may be made by those skilled in the art. For example, a board may be added the sides of which have been electrically connected as in FIGURE 1*b*; alternatively, several internal boards may be connected by a hole formed (and subsequently plated) through all the then bonded boards without the formation of an electrical connection to the topmost surface. Thus the invention herein described is to be construed as limited only by the spirit and scope of the appended claims.

What is claimed is:

1. The method of forming a multilayer laminate having a plurality of circuit patterns separated by insulating material and connected by metallic conductors extending therethrough comprising the steps of: forming a predetermined hole pattern in a first layer of insulating material having first and second circuit patterns on the surfaces thereof, said first predetermined hole pattern comprising holes which extend through said first layer only; forming a plurality of electrical conductors through said first predetermined hole pattern to connect said first and second circuit patterns by coating the walls of said holes with conductive material; filling certain of the coated holes with insulating material; bonding a second layer of insulating material having third and fourth circuit patterns on the surfaces thereof to said first layer of insulating material; forming a second predetermined hole pattern in said first and second layers of insulating material, said second predetermined hole pattern comprising holes extending through said first and second layers only; forming a plurality of electrical conductors through said second predetermined hole pattern to connect said first circuit pattern to said third and fourth circuit patterns by coating the walls of said holes with conductive material, said third and fourth circuit patterns being connected where appropriate by said plurality of electrical conductors through said second predetermined hole pattern; and repeating said steps until the desired plurality of separate circuit patterns is attained.

2. The method of claim 1 wherein said electrical conductors are formed by plating the walls of said holes.

3. The method of claim 1 further comprising the step of filling other of said holes with a conductive material.

4. The method of claim 1 wherein said first and second layers are bonded together by a layer of plastic insulating material.

References Cited

UNITED STATES PATENTS

| | | | |
|---|---|---|---|
| 2,366,274 | 1/1945 | Luth et al. | 29—630 |
| 2,981,868 | 4/1961 | Severson | 29—627 XR |
| 3,052,823 | 9/1962 | Anderson et al. | 317—101 |
| 3,264,402 | 8/1966 | Shaheen et al. | 29—625 X |

FOREIGN PATENTS

| | | |
|---|---|---|
| 1,256,632 | 2/1961 | France. |
| 6,402,328 | 8/1964 | Netherlands. |

JOHN F. CAMPBELL, *Primary Examiner.*

R. W. CHURCH, *Assistant Examiner.*

U.S. Cl. X.R.

29—625, 627, 530; 117—212; 156—3; 174—68.5; 204—15; 264—272; 317—101